United States Patent [19]
Kimura

[11] Patent Number: 5,420,513
[45] Date of Patent: May 30, 1995

[54] DIELECTRIC BREAKDOWN PREDICTION AND DIELECTRIC BREAKDOWN LIFE-TIME PREDICTION USING ITERATIVE VOLTAGE STEP STRESSING

[75] Inventor: Mikihiro Kimura, Itami, Japan

[73] Assignee: Mitsubishi Denki Kabushiki Kaisha, Tokyo, Japan

[21] Appl. No.: 91,359

[22] Filed: Jul. 15, 1993

[30] Foreign Application Priority Data

Jul. 16, 1992 [JP] Japan .................................. 4-189362

[51] Int. Cl.6 ........................ G01R 27/02; G01R 27/14
[52] U.S. Cl. ..................................... 324/551; 324/719; 324/765
[58] Field of Search ............... 324/527, 537, 551, 554, 324/663, 719, 765, 769, 766; 364/488, 552; 437/8

[56] References Cited

U.S. PATENT DOCUMENTS

| | | | |
|---|---|---|---|
| 3,889,188 | 6/1975 | Trindale | 324/769 |
| 4,904,946 | 2/1990 | Hirai | 324/551 |
| 4,906,939 | 3/1990 | Berrigan et al. | 324/548 |
| 5,023,561 | 6/1991 | Hillard | 324/765 |

OTHER PUBLICATIONS

"Electrical Breakdown in Thin Gate and Tunneling Oxides"; Chen et al.; IEEE Transactions on Electron Devices, vol. Ed-32, No. 2 pp. 413–422; Feb. 1985.

"Time-Dependent Dielectric Breakdown of Thin Thermally Grown SiO$_2$ Films"; Yamabe et al.; IEEE Transactions on Electron Devices; vol. Ed-32, No. 2; pp. 423–428; Feb. 1985.

"Time–Zero Dielectric Reliability Test by a Ramp Method"; Arnold Berman; IBM General Technology Div.; pp. 204–209; New York 1981 (month unavailable).

A. Saba et al., "On the Weak Spot Concept in the Dielectric Breakdown of Thin Polyester Films", Jul. 1989, IEEE from Conference on Conduction and Breakdown in Solid Dielectrics, pp. 72–76.

*Primary Examiner*—Kenneth A. Wieder
*Assistant Examiner*—Christopher M. Tobin
*Attorney, Agent, or Firm*—Leydig, Voit & Mayer

[57] ABSTRACT

An accurate dielectric breakdown prediction method and a prediction method in which accurate time dependent dielectric breakdown (TDDB) characteristics can be obtained on the basis of dielectric breakdown prediction by a step stress method are provided. In this method, dielectric breakdown is predicted on the basis of a plurality of reference currents in accordance with an applied voltage, or a reference current $I_{cr}$ is varied as the function of the applied voltage. In the step stress TDDB prediction, a Chen-Holland-Hu model or improved Chen-Holland-Hu model is employed. Since TDDB characteristics can be obtained from only dielectric breakdown prediction, this method is advantageous for early reliability prediction.

4 Claims, 10 Drawing Sheets

DIELECTRIC BREAKDOWN PREDICTION AND DIELECTRIC BREAKDOWN LIFE-TIME PREDICTION USING ITERATIVE VOLTAGE STEP STRESSING

BACKGROUND OF THE INVENTION

1. Field of the Invention

The present invention relates to a dielectric breakdown prediction apparatus and method, and to a dielectric breakdown life-time prediction apparatus and method. More particularly, the present invention relates to a time dependent dielectric breakdown (TDDB) prediction method using a method for predicting dielectric breakdown, used for semiconductor devices, and a step stress method.

2. Description of the Related Art

FIG. 9 illustrates typical I-V characteristics based on a conventional dielectric breakdown prediction method when a voltage is applied to an electrode in a condition in which an insulating film is sandwiched by the electrode. In the conventional dielectric breakdown prediction method, a voltage $V_{BD}$ is regarded as a breakdown voltage when an observed electric current has reached a reference current $I_{cr}$.

However, insulating films such as thermally oxidized films are classified into three types of failure modes: A mode, B mode and C mode, according to defects within the insulating film. The I-V characteristics of the insulating film in these three types of failure modes are as indicated by curve 2, curve 3, and curve 1, as shown in FIG. 10. At this time, since only voltage $V_{BD}$ for the reference current $I_{cr}$ can be checked according to the conventional dielectric breakdown prediction method, breakdown voltage $V_{C,1}$ of curve 1 will not be correct though it is possible to accurately check breakdown voltages $V_{A,1}$ and $V_{B,1}$ of curves 2 and 3, respectively, by $I_{cr,1}$ 1 of FIG. 10. In this connection, if the breakdown voltage is checked by reference current $I_{cr,2}$ in order to accurately determine the $V_{C,2}$ of curve 1, voltages $V_{A,2}$ and $V_{B,2}$ are not accurate at this time.

Since, as described above, the breakdown voltage is checked using only one predetermined current $I_{cr}$ in the conventional dielectric breakdown prediction method, it is impossible to determine an accurate breakdown voltage for an insulating film having various types of failure modes.

Use of the dielectric breakdown prediction method permits TDDB characteristics based on a step stress method to be predicted, and thus there is an advantage in that the reliability of insulating films can be predicted earlier. Accordingly, in the conventional step stress TDDB prediction method, as shown in FIG. 11, $t_{BD}$ at an electric field $E_G$ is estimated from the relation of the dielectric breakdown life-time $t_{BD} \propto \exp(-\beta \cdot E_G)$ by the following equation (4):

$$t_{BD} = \left[ \sum_{i=1}^{\Sigma} \Delta t_i \exp(\beta \cdot E_G) \right] \exp(-\beta \cdot E_G) \quad (4)$$

However, when the breakdown mechanism of a thermally oxidized film was checked in detail, it was found to conform to the reference of "IEEE Trans. Electron Devices ED-32, P413 (1985), I. C. Chen, S. E. Holland, and C. Hu".

Since the TDDB prediction method obtained by equation (4) uses the relation of the dielectric breakdown life-time $t_{BD} \propto \exp(-\beta \cdot E_G)$, it is impossible to accurately obtain TDDB characteristics.

SUMMARY OF THE INVENTION

The present invention has been achieved to solve the above-mentioned problems of the prior art.

It is an object of the present invention to provide an accurate dielectric breakdown prediction apparatus and method and to obtain an accurate dielectric breakdown life-time prediction apparatus and method capable of obtaining accurate TDDB characteristics by a step stress TDDB prediction method on the basis of the results of dielectric breakdown prediction.

To achieve the above object, according to a first aspect of the present invention, there is provided a dielectric breakdown prediction apparatus comprising: a pair of electrodes placed across a specimen; a voltage applying apparatus for applying a voltage to this pair of electrodes; an amperemeter for measuring electric current flowing through said specimen; a reference current generator for generating a dielectric breakdown reference current whose value varies as the function of a voltage applied to said specimen; and a current comparator for determining the dielectric breakdown of said specimen by comparing the value of current flowing through said amperemeter with the value of said dielectric breakdown reference current.

According to a second aspect of the present invention, there is provided an dielectric breakdown life-time prediction apparatus comprising: a pair of electrodes placed across a specimen; a step voltage applying apparatus for applying an electric-field intensity $E_i$ to this pair of electrodes for a step time $\Delta t_i$; an amperemeter for measuring electric current I flowing through said specimen; a reference current generator for generating a dielectric breakdown reference current $I_{cr}$ whose value varies as the function of a voltage applied to the specimen; a current comparator for comparing the value of current flowing through said specimen with the value of said dielectric breakdown reference current; and a counter for counting the number of steps N until said specimen breaks down; and a dielectric breakdown life-time calculation apparatus for determining the dielectric breakdown life-time $t_{BD}$ from the following equation (1) when there is one type of acceleration factor G in the entire area of the electric-field intensity $E_G$:

$$t_{BD} = \left[ \sum_{i=1}^{N} \Delta t_i \exp(-G/E_i) \right] \exp(G/E_G). \quad (1)$$

According to a third aspect of the present invention, there is provided a dielectric breakdown life-time prediction apparatus comprising: a pair of electrodes placed across a specimen; a step voltage applying apparatus for applying an electric-field intensity $E_i$ to this pair of electrodes for a step time $\Delta t_i$; an amperemeter for measuring electric current I flowing through said specimen; a reference current generator for generating a dielectric breakdown reference current $I_{cr}$ whose value varies as the function of a voltage applied to the specimen; a current comparator for comparing the value of current flowing through said specimen with the value of said dielectric breakdown reference current; and a counter for counting the number of steps N until said specimen breaks down; and a dielectric breakdown life-time calculation apparatus for determining the dielectric breakdown life-time $t_{BD}$ from the following equation (2) or (3) when there are acceleration factors $G_A$ and $G_B$ across the critical electric-field $E_{cr}$:

$$t_{BD} = \left[\sum_{i=1}^{j-1} \Delta t_i \exp(-G_A/E_i) + \left[\sum_{i=j}^{N} \Delta t_i \exp((G_B - G_A)/E_{cr} - G_B/E_i)\right]\exp(G_A/E_G)\right. \quad (2)$$

(when $E_G < E_{cr}$), or $$t_{BD} = \left[\sum_{i=j}^{N} \Delta t_i \exp(-G_B/E_i) + \left[\sum_{i=j}^{j-1} \Delta t_i \exp((G_A - G_B)/E_{cr} - G_A/E_i)\right]\exp(G_B/E_G)\right. \quad (3)$$

(when $E_G \geq E_{cr}$).

According to a fourth aspect of the present invention, there is provided a dielectric breakdown prediction method comprising the steps of: applying a voltage across a specimen; measuring electric current flowing through said specimen; generating a dielectric breakdown reference whose value varies as the function of a voltage applied to said specimen; and determining the dielectric breakdown of said specimen by comparing the value of the dielectric breakdown reference current with the value of current flowing through said specimen.

According to a fifth aspect of the present invention, there is provided a dielectric breakdown prediction method comprising the steps of: applying an electric-field intensity $E_i$ across a specimen for a step time $\Delta t_i$; measuring electric current I flowing through said specimen; generating a dielectric breakdown reference current $I_{cr}$ whose value varies as the function of a voltage applied to the specimen; comparing the value of current flowing through said specimen with the value of said dielectric breakdown reference current; counting the number of steps N until said specimen breaks down; and determining an acceleration factor G and a dielectric breakdown life-time $t_{BD}$ from the following equation (1) when there is an acceleration factor G in the entire area of the electric-field intensity $E_G$:

$$t_{BD} = \left[\sum_{i=1}^{N} \Delta t_i \exp(-G/E_i)\right]\exp(G/E_G). \quad (1)$$

According to a sixth aspect of the present invention, there is provided a dielectric breakdown prediction method comprising the steps of: applying an electric-field intensity $E_i$ across a specimen for a step time $\Delta t_i$; measuring electric current I flowing through said specimen; generating a dielectric breakdown reference current $I_{cr}$ whose value varies as the function of a voltage applied to the specimen; determining the dielectric breakdown of said specimen by comparing the value of said dielectric breakdown reference current with the value of current flowing through said specimen by means of an amperemeter; counting the number of steps N until said specimen breaks down; and determining an acceleration factor G and a dielectric breakdown life-time $t_{BD}$ from the following equation (2) or (3) when there are two types of acceleration factors $G_A$ and $G_B$ across the critical electric-field $E_{cr}$:

$$t_{BD} = \left[\sum_{i=1}^{j-1} \Delta t_i \exp(-G_A/E_i) + \left[\sum_{i=j}^{N} \Delta t_i \exp((G_B - G_A)/E_{cr} - G_B/E_i)\right]\exp(G_A/E_G)\right. \quad (2)$$

(when $E_G < E_{cr}$), or $$t_{BD} = \left[\sum_{i=j}^{N} \Delta t_i \exp(-G_B/E_i) + \left[\sum_{i=j}^{j-1} \Delta t_i \exp((G_A - G_B)/E_{cr} - G_A/E_i)\right]\exp(G_B/E_G)\right. \quad (3)$$

(when $E_G \geq E_{cr}$).

DESCRIPTION OF THE PREFERRED EMBODIMENTS

First Embodiment

Figure 1:
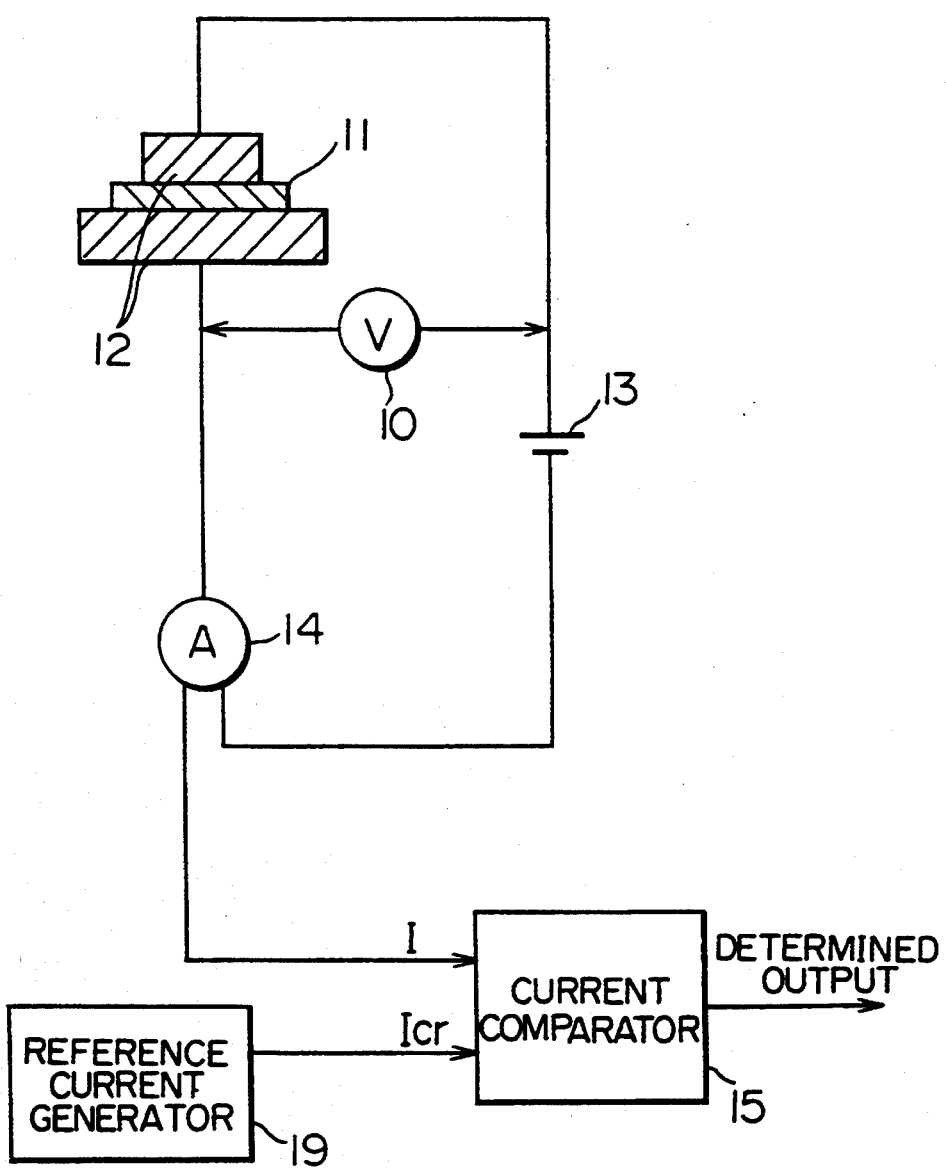
FIG. 1 is a schematic illustration of a dielectric breakdown prediction apparatus and method in accordance with an embodiment of the present invention.

FIG. 1 shows a schematic illustration of a dielectric breakdown prediction apparatus and method in accordance with a first embodiment of the present invention. A voltage V is applied across both ends of an electrode 12 by means of a voltage applying apparatus 13 in a condition in which an insulating film 11, a specimen to be measured, is sandwiched by the electrode 12. An electric current flowing through the insulating film 11 is measured by an amperemeter A placed in series to the voltage applying apparatus 13, and V-I characteristics can be obtained.

Next, the measured electric current I is compared by a current comparator 15 with a dielectric breakdown reference current $I_{cr}$ generated by a reference current generation apparatus 19 for generating dielectric breakdown reference current whose value varies as a function of the voltage applied to the specimen. When $I > I_{cr}$, this is determined to be a dielectric breakdown.

Figure 2:
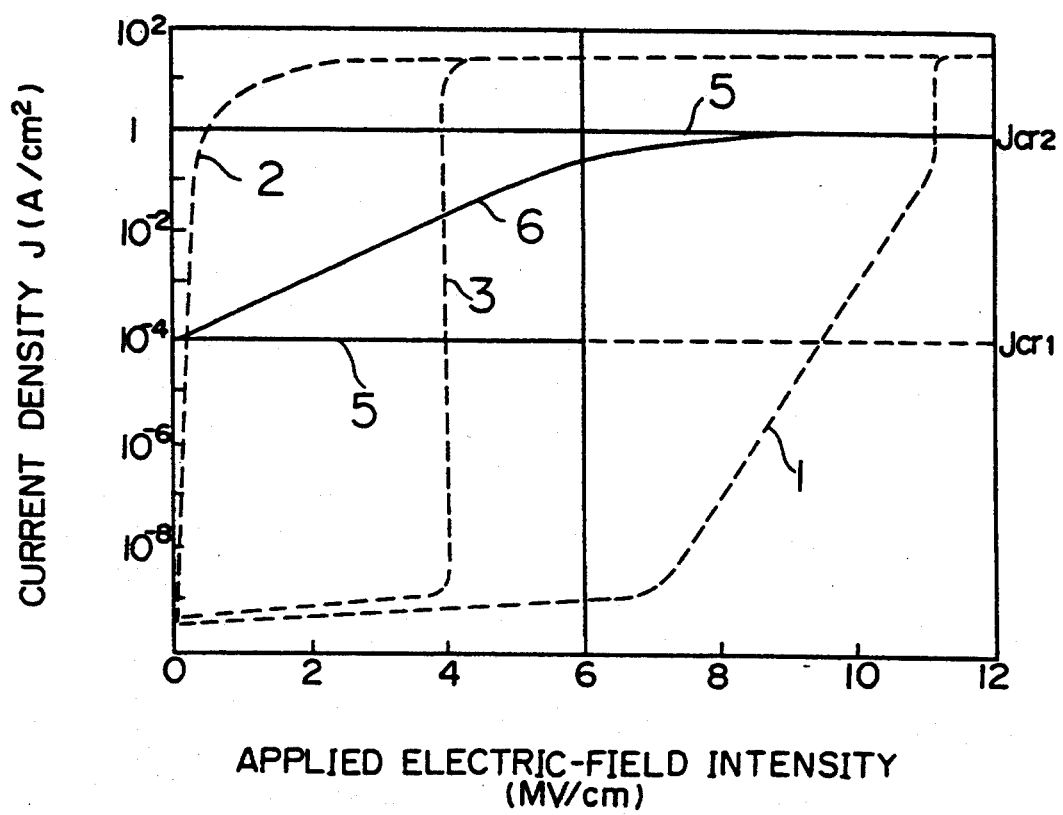
FIG. 2 is a diagram illustrating the relationship between an applied electric field E and an electric current density J of an $SiO_2$ film measured by the apparatus of FIG. 1.

FIG. 2 illustrates the relationship between an applied electric field E of an $SiO_2$ film and an electric current density J flowing through the insulating film measured by the dielectric breakdown prediction apparatus of FIG. 1. In FIG. 2, the electric field intensity E=applied voltage V/thickness of the specimen, and current density=current value I per unit area.

The dotted line 1 of FIG. 2 indicates the V-I characteristics of an $SiO_2$ film free from defects; the dotted line 2 indicates the V-I characteristics of a specimen having initial defects such as pinholes on the film; and the dotted line 3 indicates the V-I characteristics of a specimen having a weak portion in part on the film.

In the specimen of the dotted line 1, a slight current not greater than a current density J of $10^{-9} A/cm^2$ flows up to a rate of an applied electric field of approximately 7 MV/cm. If the applied electric field exceeds 7 MV/cm, the electric current increases sharply, and breaks down at nearly 11 MV/cm (C mode failure).

On the other hand, in the specimen of dotted line 2, an electric current flows sharply at a rate of an applied electric field of 0.2 MV/cm or less, causing initial breakdown (A mode failure).

In the specimen of the dotted line 3, if the applied electric-field exceeds 4 MV/cm, breakdown caused by a weak film occurs (B mode failure).

Next, a dielectric breakdown prediction method in accordance with the present invention will be explained. In FIG. 2, the solid line 5 indicates an example in which a reference current density for two types of dielectric breakdowns is provided on the basis of the applied electric field. If $J_{cr1}$ is set so that it equals $10^{-4} A/cm^2$ when the applied electric field is 6 MV/cm or less, and $J_{cr2} = 1 A/cm^2$ when the applied electric field is 6 MV/cm or more, then A mode failure and B mode failure are confirmed on the basis of $J_{cr1}$, and C mode failure is confirmed on the basis of $J_{cr2}$ in the order of the descending electric fields.

Second Embodiment

The solid line 6 of FIG. 2 indicates changes in the reference current density $J_{cr}(E)$ as the function of the applied electric field, i.e., the voltage applied to the specimen. Although in the present invention the reference current value is described as the function of the applied voltage, needless to say, the same effect can be shown even if it is replaced with electric field or current density.

If the reference current is assumed that the dotted line 6 of FIG. 2 satisfies $J_{cr}(E) = \kappa \cdot E + J_{cr1}$, accurate dielectric breakdown electric-field values can be determined for A mode failure, B mode failure, and C mode failure in the order of the descending electric fields in the same way as in the first embodiment.

Third Embodiment

Use of the dielectric breakdown prediction apparatus in accordance with the present invention makes it possible to predict TDDB characteristics on the basis of the step stress method.

Figure 3:
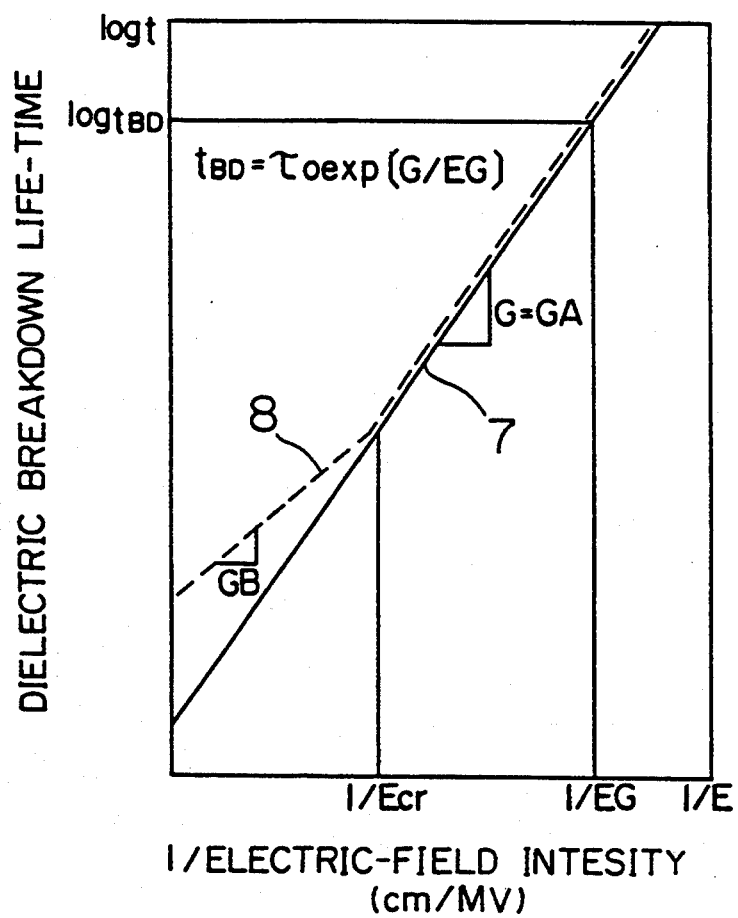
FIG. 3 is a diagram illustrating the dielectric breakdown life-time prediction apparatus and method which is applied to a step stress TDDB prediction method of the present invention.

On the basis of a CHH model, the relationship between an applied electric-field intensity $E_G$ and an dielectric breakdown life-time $t_{BD}$ is given as follows:

$$t_{BD} = \tau_0 \exp(G/E_G)$$

where $\tau_0$ is the proportional coefficient, and G is a coefficient called an acceleration factor. This relationship is shown in FIG. 3. The inclination of the straight line 7 is the acceleration factor G.

Assuming that a step stress electric-field $E_i$ is applied to the insulating film for time $\Delta t_i$, and that dielectric breakdown occurs when this application is continued for N steps, $t_{BD}$ is expressed by the following equation (5):

$$t_{BD} = \sum_{i=1}^{N} t_i \tag{5}$$

where $t_i$ is the conversion time indicating a contribution to lengthening the lifetime as a result of the step stress electric-field $E_i$ being applied for $\Delta t_i$ with respect to the life-time $t_{BD}$ when an arbitrary applied electric-field $E_G$ is applied, and expressed as follows:

$$t_i = (\Delta t_i \exp(-G/E_i)) \exp(G/E_G)$$

In other words, this can be written as the following equation (6):

$$t_{BD} = \sum_{i=1}^{N} (\Delta t_i \exp(-G/E_i)) \exp(G/E_G) \tag{6}$$

This means that the life-time $t_{BD}$ based on the step stress method can be predicted. The step stress electric-field $E_i$ is successively applied to the insulating film specimen for the time $\Delta t_i$. The number of steps N is determined from when the current I flowing through the insulating film exceeds a current reference value $I_{cr}$ until dielectric breakdown occurs, making it possible to determine the life-time $t_{BD}$. In the above equation, the acceleration factor G is a coefficient closely related to the mechanism of dielectric breakdown, and can be expressed by $G = B + H$.

Figure 5:
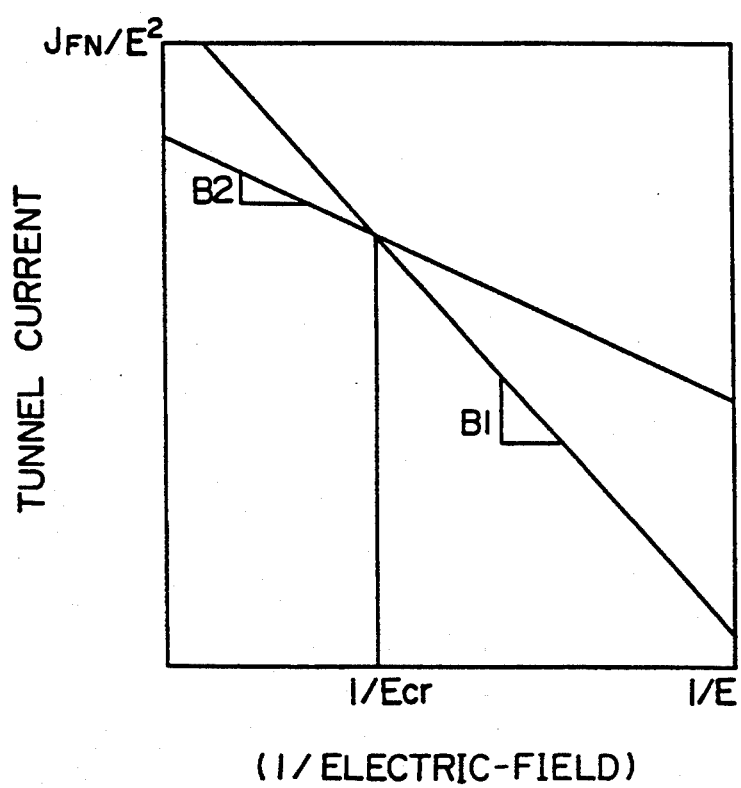
FIG. 5 is a diagram illustrating an F-N plot.

B is obtained by measuring Fowler-Nordheim's tunnel current $J_{FN}$ shown in FIG. 5. The electric-field dependence of the tunnel current $J_{FN}$ is determined as the coefficient of the following equation (7):

$$J_{FN} \propto E^2_G \exp(-B/E_G) \tag{7}$$

and an example thereof is B=240 MV/cm.

A hall generation rate during collision ionization is determined on the basis of the following equation (8):

$$\alpha \propto \exp(-H/E_G) \tag{8}$$

and an example thereof is H=80 MV/cm.

Figure 4:
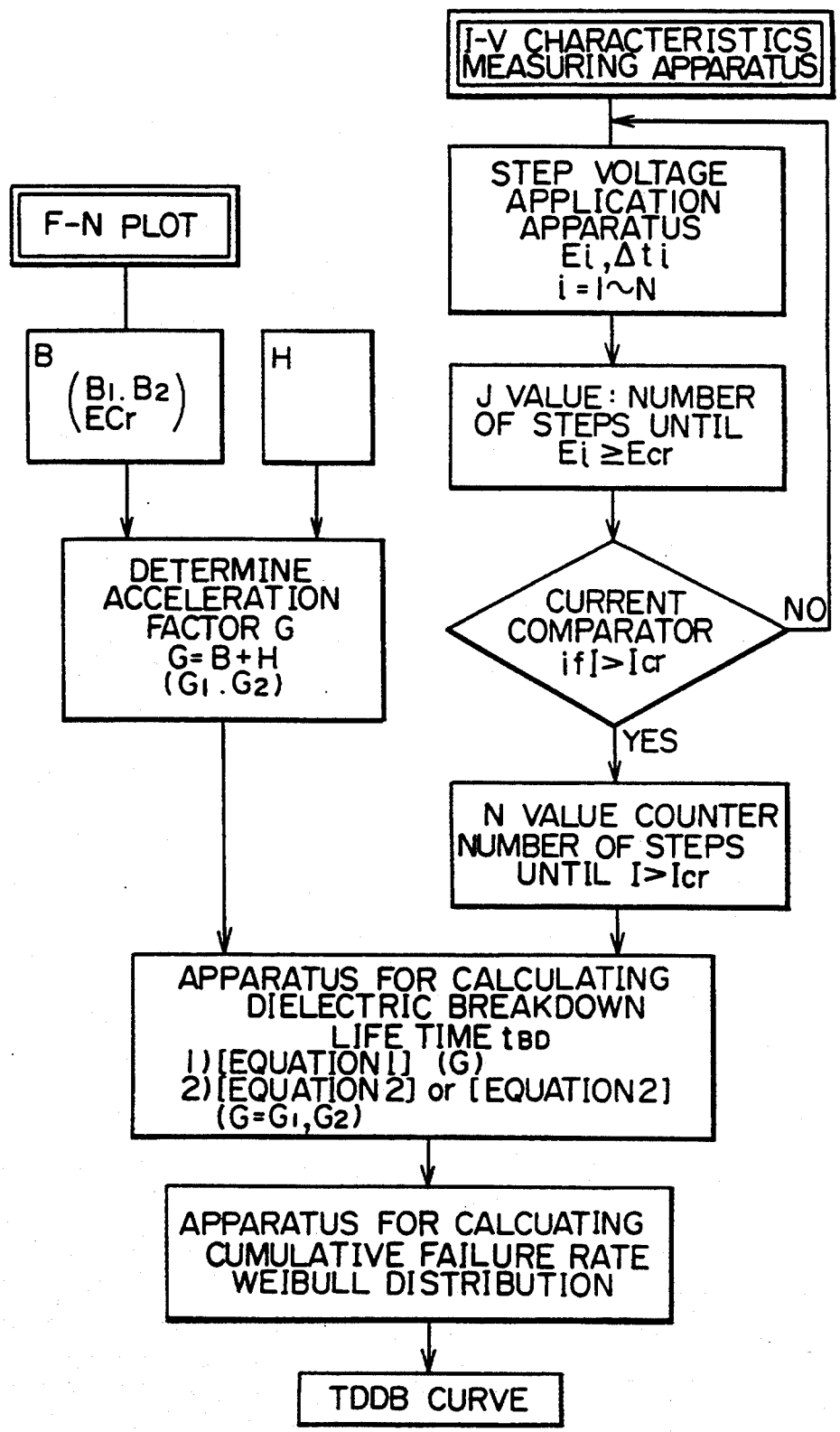
FIG. 4 is a flowchart for the dielectric breakdown life-time prediction apparatus and method based on the step stress TDDB prediction method.

FIG. 4 is a flowchart illustrating a step for determining the dielectric breakdown life-time $t_{BD}$ on the basis of the above-described step stress method.

Initially, the acceleration factor G is determined in accordance with the flowchart shown on the left side of FIG. 4. An F-N plot shown in FIG. 5 is created in a tunnel current experiment, and the coefficient B is determined on the basis of the inclination thereof.

Similarly, H is determined in a hall generation rate experiment during collision ionization, and the acceleration factor G is determined as the sum of B and H.

Next, I-V characteristics are measured in accordance with the flowchart shown on the right side of FIG. 4. The step stress electric-field intensity $E_i$ is applied to the insulating film for time $\Delta t_i$. The observed current value I is compared with the current reference value $I_{cr}$ for dielectric breakdown, and the number of steps N from when the current exceeds $I_{cr}$ until dielectric breakdown occurs is determined. When N and B are determined in the above-described way, life-time $t_{BD}$ can be determined by the following equation (1):

$$t_{BD} = \left[ \sum_{i=1}^{N} \Delta t_i \exp(-G/E_i) \right] \exp(G/E_G) \quad (1)$$

Fourth Embodiment

When the relationship between the dielectric breakdown life-time $t_{BD}$ and the electric field intensity $E_G$ is studied, as indicated by the dotted line 8 of FIG. 3, it can be observed that the Chen-Holland-Hu model is not satisfied in an electric field higher than the critical electric field $E_{cr}$. The present invention provides an improved Chen-Holland-Hu model for this situation in which the acceleration factor for $E_G < E_{cr}$ is set to $G_A$ and the acceleration factor for $E_G > E_{cr}$ is set to $G_B$.

In the third embodiment, $t_{BD}$ for the acceleration factors for two types of $G_A$ and $G_B$ is given by the following equation (2) or (3):

$$t_{BD} = \left[ \sum_{i=1}^{j-1} \Delta t_i \exp(-G_A/E_i) + \right. \quad (2)$$

$$\left. \sum_{i=j}^{N} \Delta t_i \exp((G_B - G_A)/E_{cr} - G_B/E_i) \right] \exp(G_A/E_G)$$

(when $E_G < E_{cr}$), or $$t_{BD} = \left[ \sum_{i=j}^{N} \Delta t_i \exp(-G_B/E_i) + \right. \quad (3)$$

$$\left. \sum_{i=j}^{j-1} \Delta t_i \exp((G_A - G_B)/E_{cr} - G_A/E_i) \right] \exp(G_B/E_G)$$

(when $E_G \geq E_{cr}$)

where j is the number of steps until $E_j \geq E_{cr}$.

This means that when the dielectric breakdown life-time $t_{BD}$ is determined when the applied voltage $E_G < E_{cr}$, the first term on the right side in equation (2) indicates a contribution to lengthen the life-time for the step stress $E_i < E_{cr}$, and the second term indicates a contribution to lengthening the life-time for the step stress $E_i$ when $E_i \geq E_{cr}$.

Similarly, in equation (3), the first term on the right side indicates a contribution to lengthening the life-time for the step stress $E_i > E_{cr}$, and the second term indicates a contribution to lengthening the life-time for the step stress $E_i < E_{cr}$.

Referring to the flowchart of FIG. 4, the step for determining the dielectric breakdown life-time $t_{BD}$ when the acceleration factor G assumes $G_1$ and $G_2$ across the critical electric-field $E_{cr}$ will now be explained. First, on the basis of the F-N plot shown in FIG. 4 obtained by the tunnel current experiment in accordance with the flowchart on the left side, the critical electric-field $E_{cr}$, and two acceleration factors $B_1$ and $B_2$ are obtained. Thus, $G_1$ and $G_2$ can be obtained from $G=B+H$.

Next, the number of steps N until the step stress electric-field $E_i$ exceeds the critical electric-field $E_{cr}$ is determined. Next, the step stress electric-field $E_i$ is successively applied to the insulating film to be measured, and the number of steps N is counted from the time when the current I flowing through the insulating film exceeds the critical electric-field $E_{cr}$ until dielectric breakdown occurs.

The dielectric breakdown life-time $t_{BD}$ is determined from equation (1), (2) or (3) by using the above-determined j, N, $G_1$, $G_2$ and $E_{cr}$.

Fifth Embodiment

The dielectric breakdown life-time $t_{BD}$ based on the step stress method can be obtained by using the dielectric breakdown life-time $t_{BD}$ determined in the third and fourth embodiments.

When the dielectric breakdown life-time $t_{BD}$ is determined, a cumulative failure rate $F(t_{BD})$ can be obtained by the following equation (9) by using, for example, a Weibull distribution:

$$F(t_{BD}) = 1 - \exp\{-t_{BD} m/t_0\} \quad (9)$$

where t and m are constants determined in accordance with an experiment in a Weibull plot.

Figure 6:
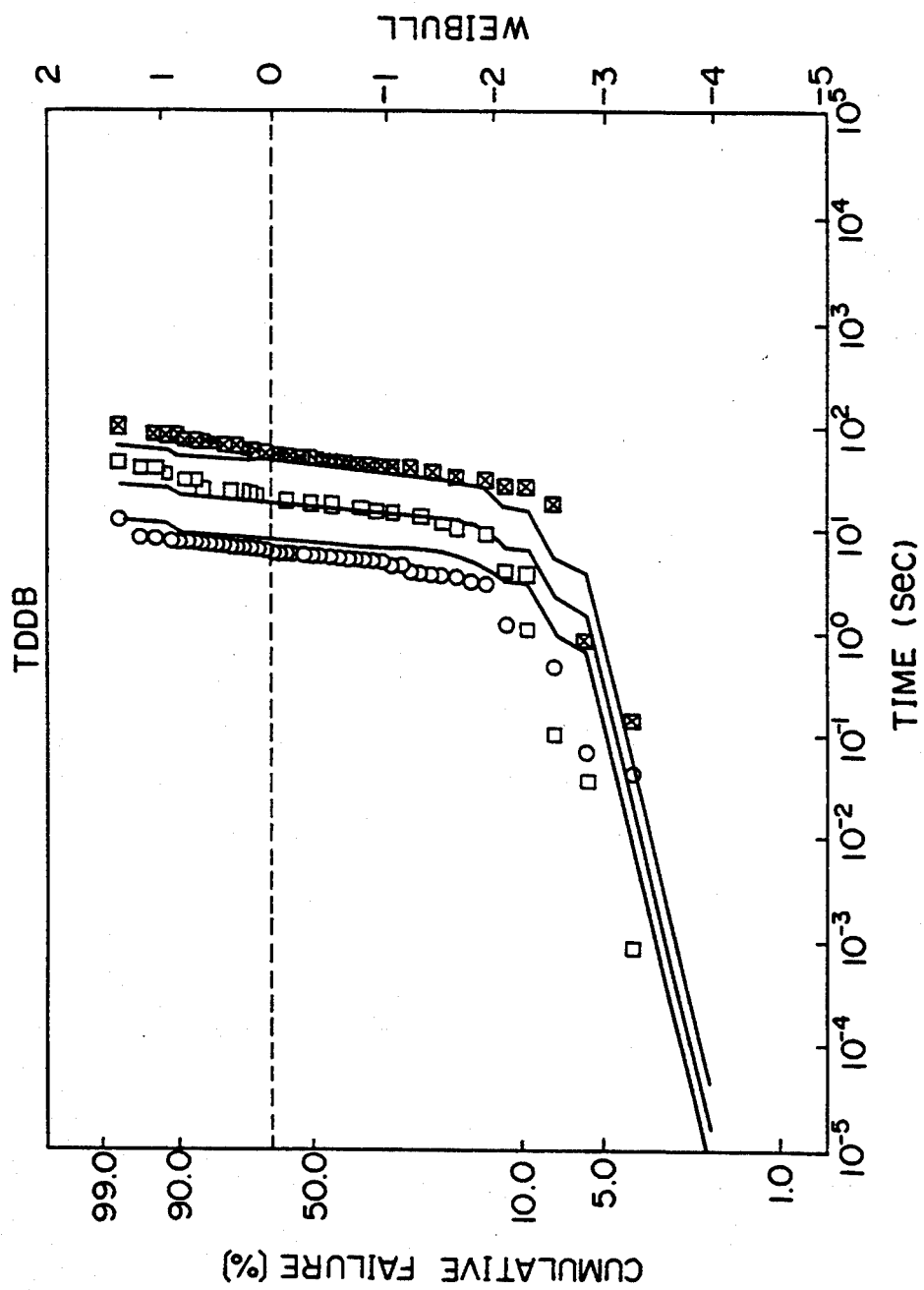
FIG. 6 is a diagram showing the results of the step stress TDDB prediction method in accordance with the present invention and the actual TDDB results.

FIG. 6 is a diagram in which $t_{BD}$ based on the improved Chen-Holland-Hu model described in the fourth embodiment is plotted using the applied voltage $E_G$ as a parameter. In FIG. 6, the solid line indicates calculated values in accordance with the present invention, and marks (O □X) indicate experimental values. Comparison with the above shows that satisfactory matches can be obtained from the initial failure until wear failure.

Figure 7:
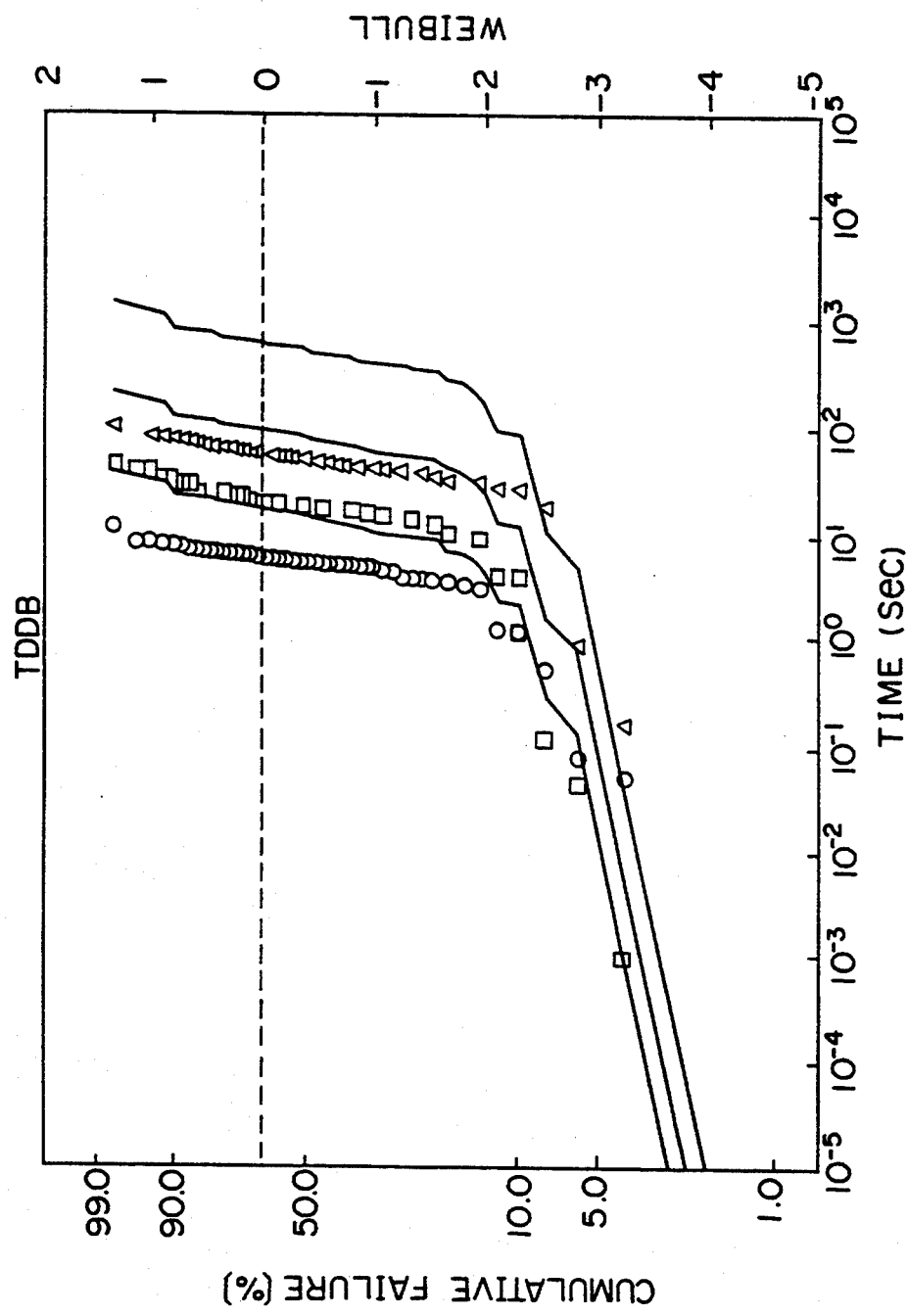
FIG. 7 is a characteristics comparison view when only a G factor of a low electric field is used.
Figure 8:
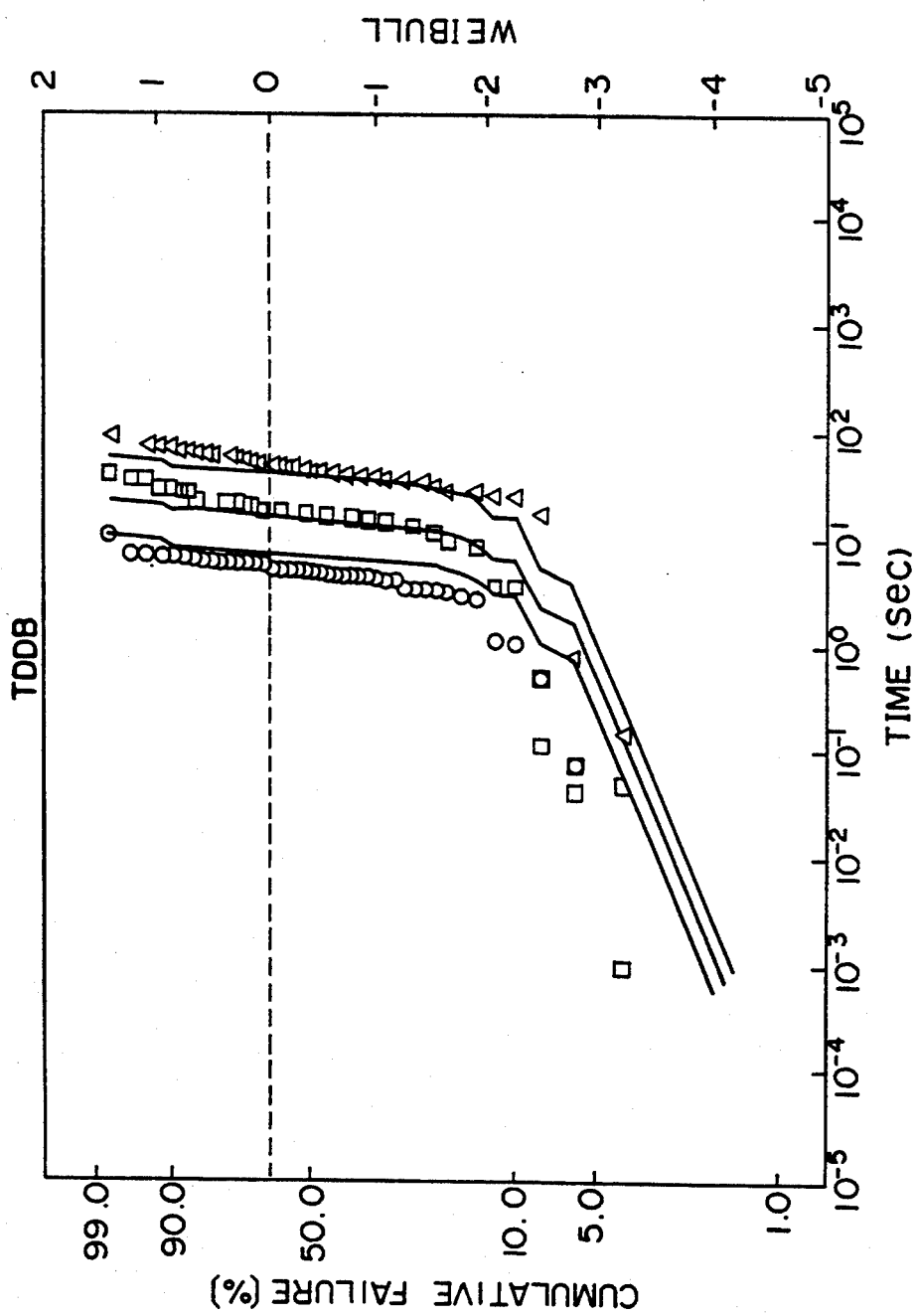
FIG. 8 is a characteristics comparison view when only a G factor of a high electric field is used.
Figure 9:
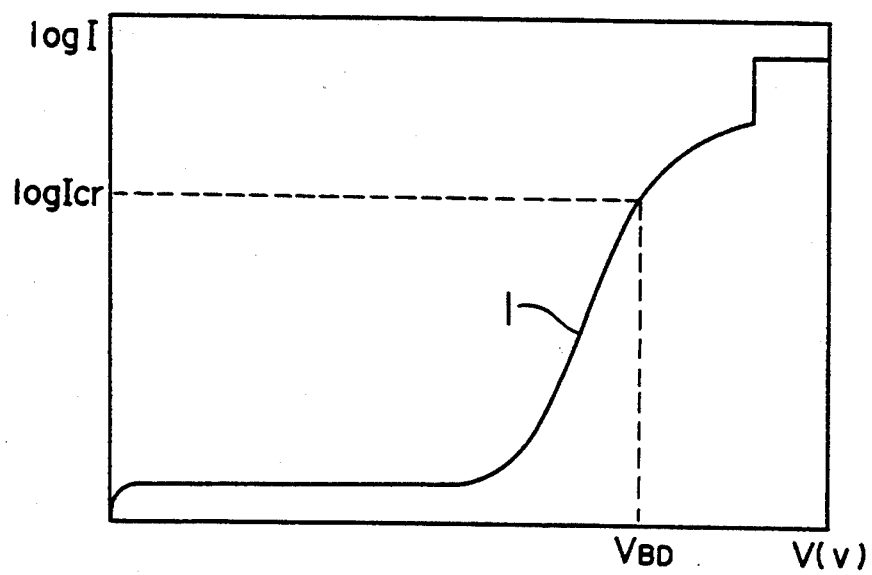
FIG. 9 is a diagram illustrating a conventional dielectric breakdown prediction method.
Figure 10:
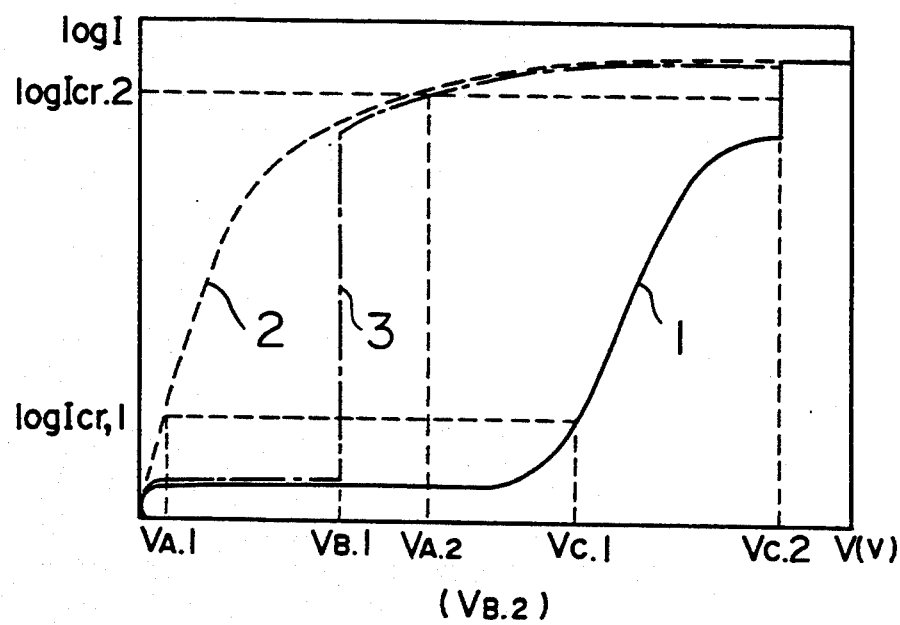
FIG. 10 shows an I-V characteristics view of an insulating film for each failure mode.
Figure 11:
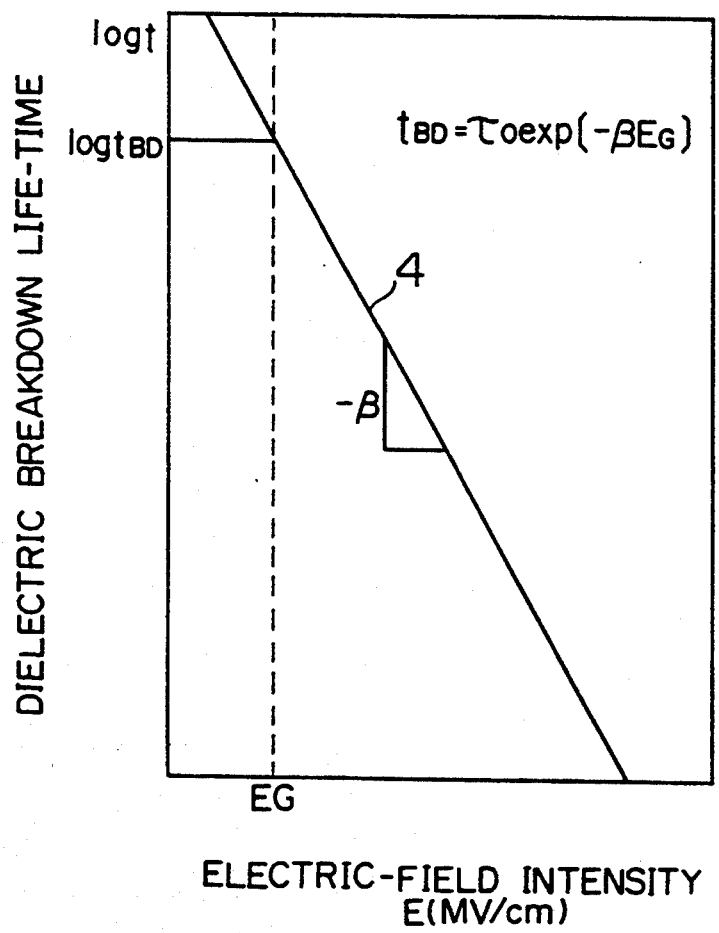
FIG. 11 is a diagram illustrating a conventional dielectric breakdown life-time prediction method.

For reference, a TDDB curve when an acceleration parameter is made constant is shown in FIGS. 7 and 8. When only the G factor of the low electric field of FIG. 7 is used, there is a great discrepancy between calculated and experimented values in the long life-time portion. When only the G factor of a high electric field of FIG. 8 is used, there is a great discrepancy between calculated and experimented values in the short life-time portion.

As described above, according to the dielectric breakdown prediction apparatus and method of the present invention, since the reference current $I_{cr}$ is varied in accordance with the applied voltage, a plurality of breakdown voltages can be determined. As a result, it is possible to accurately check the pressure resistance distribution of an insulating film.

According to the step stress TDDB prediction method of the present invention, since a Chen-Holland-Hu model or improved Chen-Holland-Hu model is employed, TDDB characteristics can be accurately obtained on the basis of the dielectric breakdown prediction method. Thus, reliability prediction can be realized in a short time.

What is claimed is:

1. A dielectric breakdown life-time prediction apparatus comprising:
   a pair of electrodes placed across a specimen;
   a step voltage applying apparatus for applying an electric-field intensity $E_i$ to said pair of electrodes for a step time $\Delta t_i$;
   a current meter for measuring electric current I flowing through said specimen;
   a reference current generator for generating a dielectric breakdown reference current $I_{cr}$ whose value varies as a function of a voltage applied to the specimen;

a current comparator for comparing the value of current flowing through said specimen with the value of said dielectric breakdown reference current; and a counter for counting the number of steps N until said specimen breaks down; and a dielectric breakdown life-time calculation apparatus for determining the dielectric breakdown life-time $t_{BD}$ from the following equation (1) when there is one type of acceleration factor G in the entire area of the electric-field intensity $E_G$:

$$t_{BD} = \left[ \sum_{i=1}^{N} \Delta t_i \exp(-G/E_i) \right] \exp(G/E_G) \tag{1}$$

2. An apparatus according to claim 1 further comprising: a cumulative failure rate calculation apparatus for calculating a cumulative failure rate by using the dielectric breakdown life-time $t_{BD}$.

3. A dielectric breakdown prediction method comprising the steps of:

applying an electric-field intensity $E_i$ across a specimen for a step time $\Delta t_i$;

measuring electric current I flowing through said specimen;

generating a dielectric breakdown reference current $I_{cr}$ whose value varies as a function of a voltage applied to the specimen;

comparing the value of current flowing through said specimen with the value of said dielectric breakdown reference current;

counting the number of steps N until said specimen breaks down; and determining an acceleration factor G and a dielectric breakdown life-time $t_{BD}$ from the following equation (1) when there is an acceleration factor G in the entire area of the electric-field intensity $E_G$:

$$t_{BD} = \left[ \sum_{i=1}^{N} \Delta t_i \exp(-G/E_i) \right] \exp(G/E_G) \tag{1}$$

4. A method according to claim 3 further comprising the step of: calculating a cumulative failure rate by using the dielectric breakdown life-time $t_{BD}$.

* * * * *

UNITED STATES PATENT AND TRADEMARK OFFICE
CERTIFICATE OF CORRECTION

PATENT NO. : 5,420,513
DATED : May 30, 1995
INVENTOR(S) : Mikihiro Kimura

It is certified that error appears in the above-indentified patent and that said Letters Patent is hereby corrected as shown below:

Column 10, line 2, change "," to --;--.

Signed and Sealed this

Tenth Day of October, 1995

Attest:

BRUCE LEHMAN

Attesting Officer     *Commissioner of Patents and Trademarks*